United States Patent [19]

Miyoshi et al.

[11] Patent Number: 5,362,968
[45] Date of Patent: Nov. 8, 1994

[54] OPTIC COLUMN HAVING PARTICULAR MAJOR/MINOR AXIS MAGNIFICATION RATIO

[75] Inventors: Motosuke Miyoshi, Minato; Yuichiro Yamazaki, Edogawa, both of Japan; Katsuya Okumura, Poughkeepsie, N.Y.

[73] Assignee: Kabushiki Kaisha Toshiba, Kawasaki, Japan

[21] Appl. No.: 126,968

[22] Filed: Sep. 27, 1993

[30] Foreign Application Priority Data

Sep. 25, 1992 [JP] Japan ................... 4-256879

[51] Int. Cl.$^5$ .......................................... G21K 1/093
[52] U.S. Cl. ......................... 250/396 R; 250/492.1
[58] Field of Search ......... 250/396 R, 396 ML, 492.1, 250/492.3, 492.2, 306, 307, 310

[56] References Cited

U.S. PATENT DOCUMENTS

| | | | |
|---|---|---|---|
| 4,736,106 | 4/1988 | Kushy et al. | 250/396 R |
| 4,804,851 | 2/1989 | Nixon | 250/492.2 |
| 5,013,913 | 5/1991 | Benner et al. | 250/396 R |

OTHER PUBLICATIONS

Brodie, *J. Vac. Sci. Technol. B*, Second Series, vol. 8, No. 6, Nov./Dec. 1990, pp. 1691-1697.

Primary Examiner—Jack I. Berman
Assistant Examiner—James Beyer
Attorney, Agent, or Firm—Foley & Lardner

[57] ABSTRACT

An optic column is provided to obtain a micro beam in simple structure. The optic column has a line cathode and multi-pole lenses arranged in three steps. A beam orbit in the major axis direction (X direction) and a beam orbit in the minor axis direction (Y direction) cross each other on the image plane. A ratio of magnification Mx of X-directional orbit to magnification My of Y-directional orbit is coincident with a ratio of width W to length H of the line cathode.

5 Claims, 4 Drawing Sheets

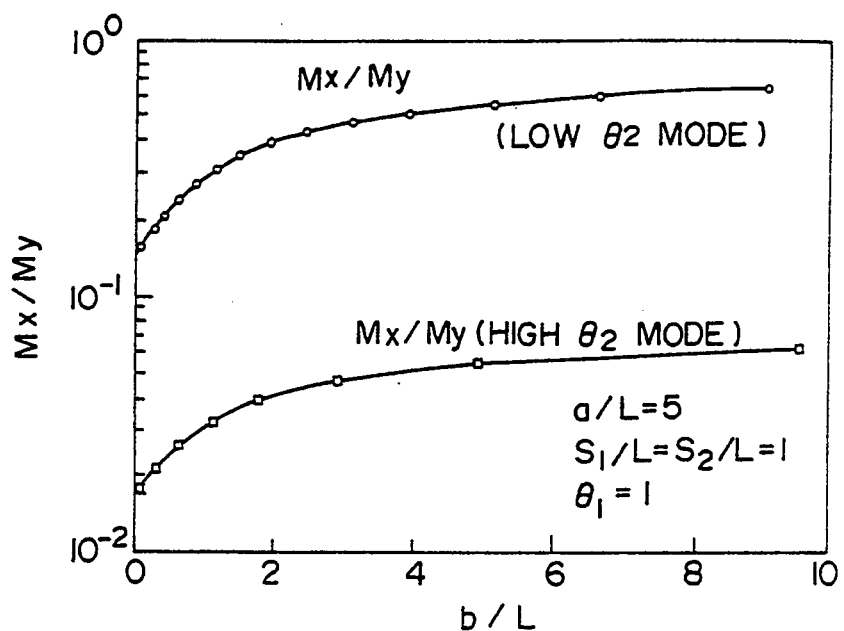
F I G. 4
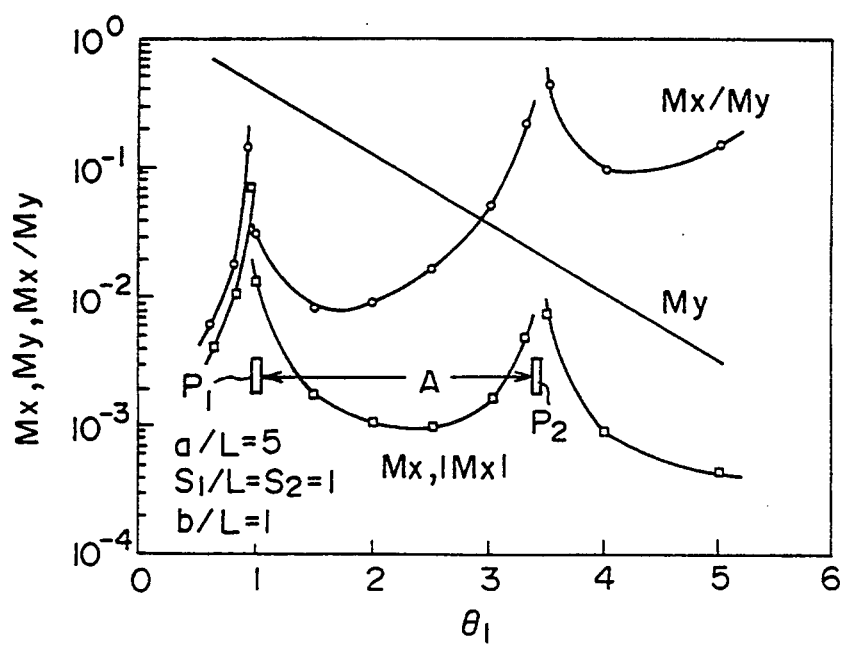
F I G. 5

OPTIC COLUMN HAVING PARTICULAR MAJOR/MINOR AXIS MAGNIFICATION RATIO

BACKGROUND OF THE INVENTION

1. Field of the Invention

The present invention relates to an optic column which can produce a micro beam (generally in 0.5 or less μm) at large current in the low energy region for example of not more than 1 keV, and particularly to an optic column which can produce a micro beam at large current in a simple structure.

2. Related Background Art

An electron optic system for obtaining a micro beam at large current conventionally employs such a popular technique that a beam from a circular hot cathode (point source of light) is focused by a demagnifying lens system into a circular beam. The electron optic system is constituted by a lens of rotation symmetry system. In this method, the upper limit of obtained current is restricted by the current density of electrons emitted from the point source and the space-charge effect, because the electrons are drawn from a small area at the tip of cathode which is the point source.

In order to eliminate this restriction, an attempt is made to increase an area contributing to the electron emission as much as possible by increasing the diameter of the cathode tip in electron gun or by face-processing the tip portion of cathode. However, even if the diameter of the tip end of cathode is increased, the maximum current is basically limited by the current density of electrons emitted from cathode and the space-charge effect near the tip end of cathode in case of the electron optic column using the lens constitution of rotation symmetry system.

To solve the problem, there is a method considered to increase the probe current by using a line cathode, which increases the area of electron emission and relieves the restriction of emission current forced by the space-charge effect. The current is expected to increase in this arrangement as the emission area increases, because the space charge basically affects the current density.

The line cathode was proposed by Brodie and Nixon (J. Vac. Sci. Technol. B7 (6), November/December, p1878, 1989). They conducted theoretical analysis while observing the spread of emission energy caused by the Boersch effect in the space-charge effect of line cathode. They found that 27% of energy spread was alleviated as compared with the conventional point (circular) cathode. They explained it as the alleviation of space-charge effect by means of the line cathode. There is, however, nothing described in the document about the increase effect of maximum emission current amount itself with increase of emission area.

The alleviation due to the Boersch effect decreases the energy spread, whereby the beam diameter is prevented from being widened by the chromatic aberration of lens system. This results in improving the performance of focusing lens. The chromatic aberration increases its influence in the low energy region, and therefore this method is very effective to obtain a micro beam at large current and in low energy.

Nixon (U.S. Pat. No. 4,804,851) proposed an idea to form a line image of a line cathode. A beam is shaped by an aperture or slit (called as blocking part) to change the length (aspect ratio) of the line image.

The proposal of Nixon concerns only the formation of line image from the line cathode, which is not such a method that a micro beam is formed by beam-shaping with adjustment of excitation condition of asymmetric optic system such as a multi-pole lens.

Brodie (J. Vac. Sci. Technol. B8, p1691, 1990) proposed the method to form a line beam with variable aspect ratio (a ratio between length and width for rectangular beam) for electron beam lithography by using a doublet (device for shaping a beam by two steps of multi-pole lenses) or a triplet (device for shaping a beam by three steps of multi-pole lenses) of electric field type quadrupole lenses and the line cathode. The stigmatic focus condition is a lens condition that two-directional orbits, i.e., X orbit (major-axis orbit) and Y orbit (minor-axis orbit), are coincident with each other on image plane on the center axis (Z-axis) in multi-pole lens and that an X-directional magnification Mx is equal to a Y-directional magnification My. On the other hand, the pseudo stigmatic focus condition is a lens condition that the X-directional orbit and Y-directional orbit are coincident with each other on the image plane on the Z-axis and that Mx and My are different from each other.

Brodie describes the construction of electron optic system to obtain a line beam in aspect ratio of approximately 1:1 to 1:100 by combinations of line cathode light source with quadrupole lenses, and particularly the operation conditions of quadrupole lenses. The electron optic system of Brodie comprises, as shown in FIG. 6, a line cathode light source 11, two steps of quadrupole lenses 12 for shaping emitted electrons into a beam of arbitrary aspect ratio, two steps of magnetic field type condenser lenses 13 for demagnifying the beam shaped in rectangle to obtain a micro beam, and a magnetic field type objective lens 14.

According to the operation conditions of quadrupole lenses 12 proposed by Brodie, the excitation condition is low, so that the demagnification ratio (inverse of magnification) is low, and the magnification ratio Mx/My is also as low as about 1/10. Thus, the quadrupole lenses 12 cannot produce a micro beam, and therefore the quadrupole lenses 12 are used as lenses for probe shaping as a result. Then, the condenser lens 13 and the objective lens 14 are added as demagnifying lens system to enhance the demagnification ratio of the entire system. This results in making the electron optic system complex. In particular, the example of FIG. 6 is so arranged that the condenser lens 13 and the objective lens 14 are formed as magnetic field type lenses, which makes the entire system larger and heavier.

As for the technique for shaping and focusing a beam by means of multi-pole lens system, Okayama and Tsurushima (Japanese Laid-open Patent Application No. 60-233814 and Japanese Patent Publication No. 2-49533) proposed an idea and the optimum conditions, in which a line image is formed by quadrupole lens system from a point cathode and in which its length (aspect ratio) and current density distribution are controlled by changing the excitation condition of quadrupole lens system. Two steps of quadrupole lenses are shown as the quadrupole lens system in an embodiment, though they describe that the same effect can be achieved by a combination of more than two multi-pole lenses. However, a beam is not focused only by the multi-pole lens system either, as in Brodie. The multi-pole lens system functions only to shape the beam, and the final focusing is carried out by a magnetic field type objective lens in the conventional manner. These are applications of multi-pole lens system to obtain a line beam from a point cathode, but are different from the method for shaping and focusing a beam from line cathode into a point beam.

As described above, the method for focusing a beam from circular point source of light into a circular beam has a limit for current of obtainable electron beam due to the emission current density of electrons from cathode and the space-charge effect. On the other hand, the arrangement in combination of line cathode with quadrupole lenses, as shown in FIG. 6, can greatly relax the restriction due to the emission current density from cathode and the space-charge effect, but has a low demagnification ratio of quadrupole lens system, which makes it difficult forming a micro beam by quadrupole lens system alone and which requires an additional demagnifying lens system. This results in making the electron optic system complex and increasing the size of apparatus.

SUMMARY OF THE INVENTION

The present invention has been accomplished taking the points as described above into consideration. It is an object of the present invention to provide an optic column which can form a micro beam only by a multi-pole lens system in a simple structure.

An optic column comprises a line beam source emitting a beam and multi-pole lenses arranged in multiple steps, wherein a beam orbit in a direction of major axis of the line beam source and a beam orbit in a direction of minor axis of the line beam source cross each other on an image plane and a ratio of magnification of the beam orbit in the direction of major axis to magnification of the beam orbit in the direction of minor axis is coincident with a ratio of a length of the line beam source in the direction of minor axis to a length of the line beam source in the direction of major axis.

A beam emitted from a line beam source passes through three steps of multi-pole lenses. In the three steps of multi-pole lenses, the major axis orbit and the minor axis orbit of beam cross each other on the image plane. The ratio of magnification of major axis orbit to magnification of minor axis orbit is made coincident with the ratio of width to length of line beam source, whereby a micro beam of substantial circle is obtained on the image plane.

BRIEF DESCRIPTION OF THE DRAWINGS

FIG. 4 is a drawing to show a magnification ratio Mx/My;

FIG. 5 is a drawing to show calculation results of magnification of the X-directional orbit, magnification of the Y-directional orbit and magnification ratio in a high $\theta_2$ mode.

DESCRIPTION OF THE PREFERRED EMBODIMENT

An embodiment of the present invention will be described in detail with reference to the accompanying drawings. FIG. 1 through FIG. 5 are drawings to show the embodiment of electron optic column according to the present invention.

Figure 1:
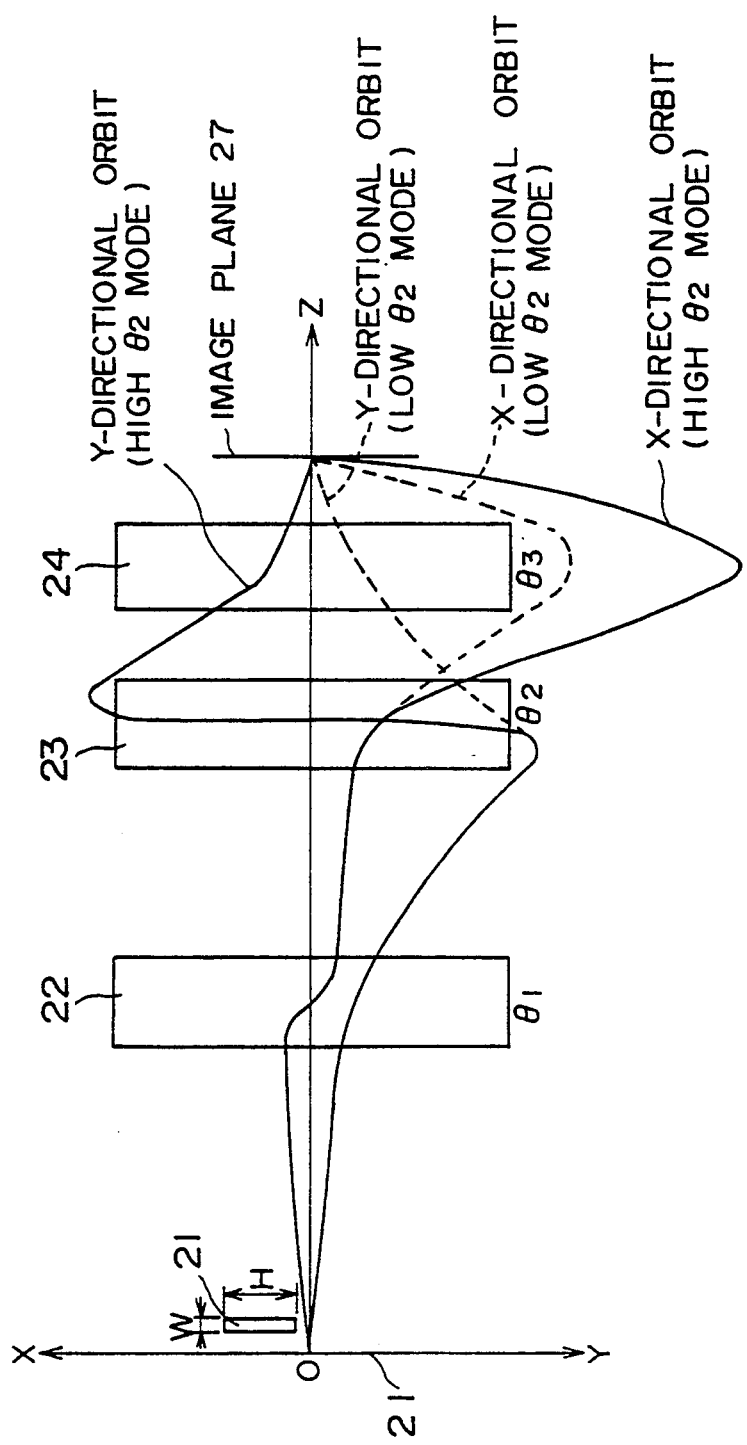
FIG. 1 is a schematic constitutional drawing to show an embodiment of optic column according to the present invention.

In FIG. 1, an electron optic column comprises an electron emission source consisting of a rectangular line cathode 21 for emitting an electron beam and quadrupole lenses 22, 23, 24 arranged in three steps (in triplet). A major-axis-directional orbit (X-directional orbit) of electron beam from line cathode 21 and a minor-axis-directional orbit (Y-directional orbit) of electron beam therefrom cross each other on an image plane 27. A ratio of magnification in the major axis direction (X direction) to magnification in the minor axis direction (Y direction), after demagnified by the three steps of quadrupole lenses 22, 23, 24, is coincident with a ratio of width W to length H of line cathode 21.

The line cathode 21 has length H and width W, as shown in FIG. 1. An electron beam from the line cathode 21 can be focused to have the length-to-width of 1:1, which means that the beam is converted into a circular beam, on the image plane 27 by making the ratio of magnification in the major axis direction to magnification in the minor axis direction coincident with the ratio of width W to length H of line cathode 21, as described above.

The magnification herein represents how much the line cathode 21 (object plane) can be demagnified on the imaging plane 27 (image plane). A lower magnification is preferable to obtain a micro beam. A magnification ratio is a ratio of magnification Mx of X-directional orbit in the direction of major axis of line cathode (in the X direction) to magnification My of Y-directional orbit in the direction of major axis (in the Y direction). The aspect ratio of line cathode (corresponding to the length of line cathode) can be made higher as the magnification ratio becomes lower. A higher aspect ratio permits a finer and longer line cathode to be used. The line cathode with higher aspect ratio increases an area of electron emission, so that a larger emission current may be obtained. Therefore, a lower magnification and a lower magnification ratio can provide an electron optic system with higher performance with respect to the object of the present invention. The quadrupole lenses 22, 23, 24 are not of rotation symmetry nor are the other multi-pole lenses.

The line cathode 21 is a hot cathode made of lanthanum hexaboride ($LaB_6$). $LaB_6$ is featured by excellent workability and large emission current density. Thus, $LaB_6$ is one of the most suitable cathode materials to obtain a large current. It should be noted that the material for cathode is not necessarily limited to $LaB_6$. For example, other cathode materials used as field emission type electron gun, such as tungsten (W) and zirconium oxide/tungsten (ZrO/W), may be used to form an electron gun after processed in a line shape.

Next described is the operation of the present embodiment constructed as above. The operation to form a micro beam by the electron optic column shown in FIG. 1 will be described with analysis of electron optic system. First described briefly is the general electron-optic property of quadrupole lens, which is the basis of analysis.

Employing the normal treatment to approximate the field distribution k (z) by a rectangular model if the length l of quadrupole lens is sufficiently greater than the aperture a, the paraxial orbit equation of electron beam in field type quadrupole lens can be expressed as follows.

$$X'' - \beta^2 k(z) X = 0$$

$$Y'' + \beta^2 k(z) Y = 0 \tag{1}$$

where $\beta^2 = V_2/V_a a^2$, $V_2$ is an applied voltage to electrode, and $V_a$ an acceleration voltage. Also, X is an X-directional distance, X" a second derivative of X, Y a Y-directional distance, and Y" a second derivative of Y.

The paraxial characteristics of quadrupole lens are as follows. The orbit of electron beam in field of quadrupole rectangular distribution can be expressed as follows if a X-directional distance, a X-directional slope, Y-directional distance, and a Y-directional slope of electron beam are represented by ($X_0$, $X_0'$, $Y_0$, $Y_0'$), respectively, on the entrance end plane of rectangular field.

$$X = X_0 \cosh\beta z + (X_0' \sinh\beta z)/\beta$$

$$Y = Y_0 \cos\beta z + (Y_0' \sin\beta z)/\beta \tag{2}$$

Accordingly, an orbit on the exit end plane of rectangular field, ($X_L$, $X_L'$, $Y_L$, $Y_L'$), can be expressed by the following matrices.

$$\begin{bmatrix} X_L \\ X_L' \end{bmatrix} = T_D \begin{bmatrix} X_0 \\ X_0' \end{bmatrix}; \begin{bmatrix} Y_L \\ Y_L' \end{bmatrix} = T_D \begin{bmatrix} Y_0 \\ Y_0' \end{bmatrix} \tag{3}$$

$$T_D = \begin{bmatrix} \cosh\theta & \frac{1}{\beta}\sinh\theta \\ \beta\sinh\theta & \cosh\theta \end{bmatrix}$$

$$T_C = \begin{bmatrix} \cos\theta & \frac{1}{\beta}\sin\theta \\ -\beta\sin\theta & \cos\theta \end{bmatrix}$$

$$\theta = \beta L$$

In Equation (3), $\theta$ is a parameter representing the excitation condition of each quadrupole lens.

The following equations provide the orbit in matrix representation on the end plane of final step lens in the optical system with three steps (triplet) of quadrupole lenses 22, 23, 24 combined as in the present invention.

$$\begin{bmatrix} X \\ X' \end{bmatrix} = [T_{C3}] \begin{bmatrix} 1 & s_2 \\ 0 & 1 \end{bmatrix} [T_{D2}] \begin{bmatrix} 1 & s_1 \\ 0 & 1 \end{bmatrix} [T_{C1}] \begin{bmatrix} 1 & a \\ 0 & 1 \end{bmatrix} \begin{bmatrix} X_0 \\ X_0' \end{bmatrix} \tag{4}$$

$$\begin{bmatrix} Y \\ Y' \end{bmatrix} = [T_{D3}] \begin{bmatrix} 1 & s_2 \\ 0 & 1 \end{bmatrix} [T_{C2}] \begin{bmatrix} 1 & s_1 \\ 0 & 1 \end{bmatrix} [T_{D1}] \begin{bmatrix} 1 & a \\ 0 & 1 \end{bmatrix} \begin{bmatrix} Y_0 \\ Y_0' \end{bmatrix}$$

In Equation (4), a is a distance between the cathode 21 and the entrance end plane of quadrupole lens 22 of first step, $s_1$ a distance between the first step quadrupole lens 22 and the second step quadrupole lens 23, and $s_2$ a distance between the second step quadrupole lens 23 and the third step quadrupole lens 24.

The focus condition is such that the X-directional orbit and the Y-directional orbit coincide with each other on the image plane 27 on Z-axis and that the magnification of X-directional orbit is different from that of Y-directional orbit (which is pseudo stigmatic). The focus condition can be represented by the following equation.

$$X/X' = Y/Y' (Mx \neq My) \tag{5}$$

Since the magnifications of X-directional orbit and Y-directional orbit are different from each other in order to focus a beam from line cathode into a circular (point) beam, the imaging is not carried out under stigmatic condition, but under pseudo stigmatic condition.

The operation of electron optic column according to the present invention is next described based on the above analytic procedure.

Figure 2:
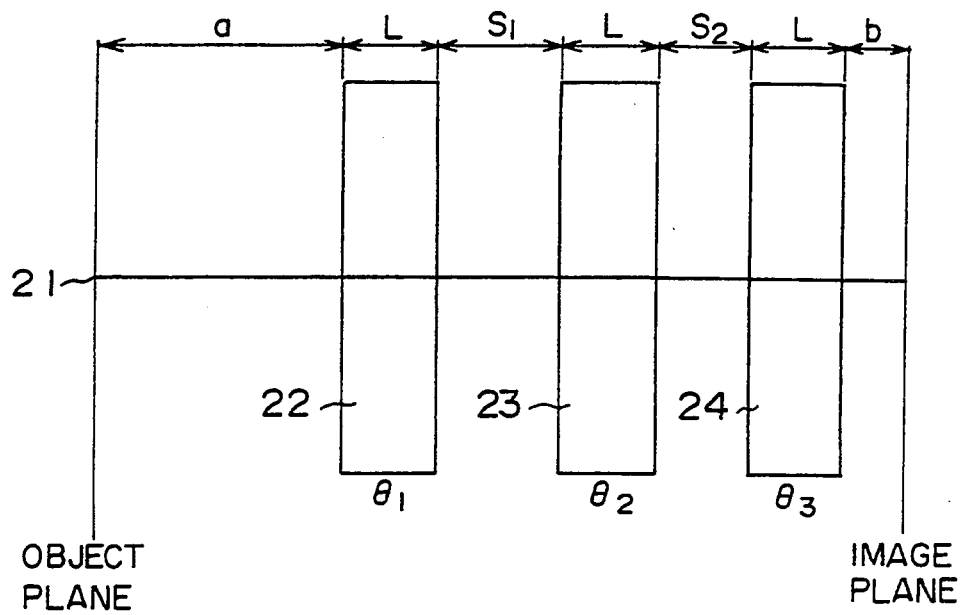
FIG. 2 is a drawing to show a model of optical system used in analysis of optic column according to the present invention.

FIG. 2 shows a model for analysis of the present invention. In FIG. 2, each of first step quadrupole lens 22, second step quadrupole lens 23 and third step quadrupole lens 24 has a lens effective length L. The effective length L corresponds to a region of electric field if the lens is approximated as rectangular. Also, a distance between the object plane (the plane on which the cathode 21 is placed) and the first step quadrupole lens 22 is a and a distance between the third step quadrupole lens 24 and the image plane 27 is b. Further, a distance between the first step quadrupole lens 22 and the second step quadrupole lens 23 is $s_1$ and a distance between the second quadrupole lens 23 and the third quadrupole lens 24 is $s_2$. The quadrupole lenses 22, 23, 24 have the excitation conditions $\theta_1$, $\theta_2$, $\theta_3$, respectively. The excitation conditions correspond to lens powers of respective quadrupole lenses.

Since the object of the present invention is to make as many electrons emitted from the line cathode as possible and to form a circular micro beam therefrom, a higher aspect ratio of line cathode (corresponding to the length of line cathode) is preferable for that purpose. Namely, electron-optic requirements for quadrupole lenses 22, 23, 24 are as follows.

(1) The lens system should preferably have the structure and the operation conditions to decrease the magnifications both in the X direction and in the Y direction. However, it is meaningless to decrease only either one of magnifications in the X direction or in the Y direction.

(2) The aspect ratio of line cathode should preferably be increased if the magnification ratio Mx/My between magnifications in X direction and in Y direction is made lower at the same time.

Figure 3:
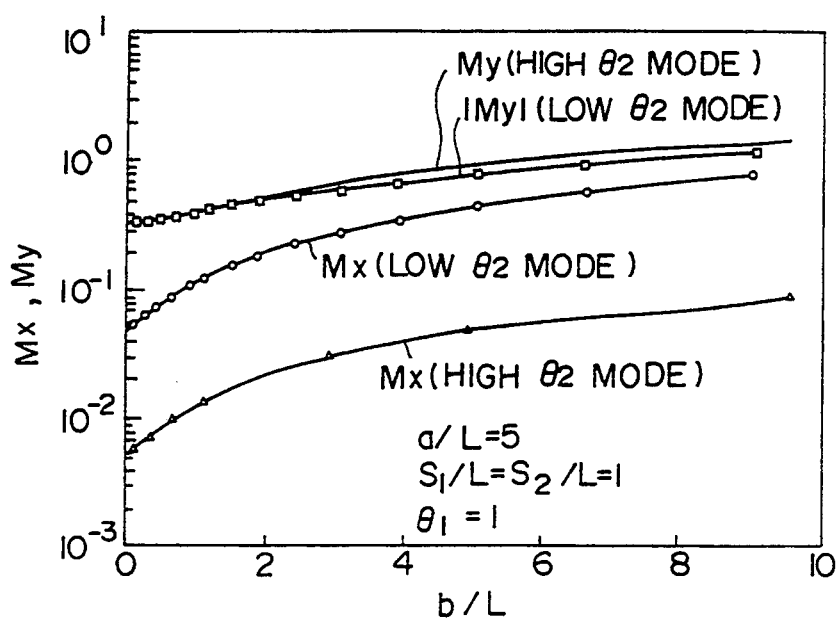
FIG. 3 is a drawing to show calculation results of magnification ratio between magnification of a X-directional orbit of beam and magnification of a Y-directional orbit of beam
Figure 6:
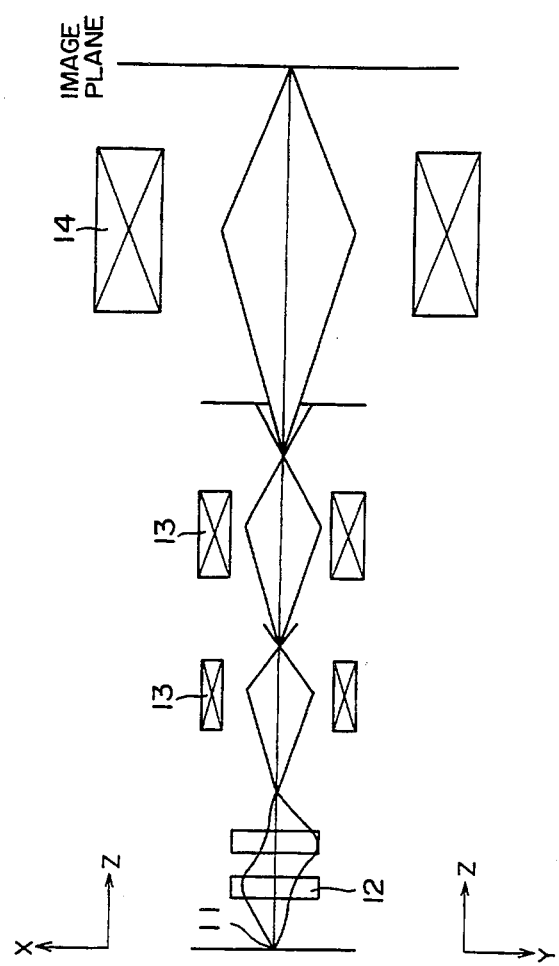
FIG. 6 is a schematic constitutional drawing to show a conventional electron optic column.

The operation analysis was done with the model shown in FIG. 2. The results are shown in FIG. 3. FIG. 3 shows calculation results of respective magnifications Mx, My of the X-directional orbit and the Y-directional orbit in multi-pole lenses arranged in three steps. The calculation was based on the excitation condition (lens power) of first step quadrupole lens as $\theta_1 = 1$ and the relations between lenses as a/L=5, $s_1/L = s_2/L = 1$. FIG. 3 shows the relations of magnification Mx of the X-directional orbit and magnification My of the Y-directional orbit with b/L. Here, b/L represents the operation distance (the distance between the third step quadrupole lens and the image plane) to the lens effective length.

If the excitation condition $\theta_1$ of the first step quadrupole lens is fixed, there always exist two or more excitation conditions $\theta_2$ for the second quadrupole lens to provide the same b/L. One of them is a case that $\theta_2$ is about 1 ($\theta_2=0.9$ in this analysis result), which is called as a low $\theta_2$ mode. Another is a case that $\theta_2$ is not less than 3 ($\theta_2=3.5$ in this analysis), which is called as a high $\theta_2$ mode. As shown in FIG. 3, both Mx and My decrease as b/L decreases. In FIG. 3, values of Mx in the high $\theta_2$ mode are always smaller by about a figure than those in the low $\theta_2$ mode.

In contrast, My is almost identical between the high $\theta_2$ mode and the low $\theta_2$ mode. Since the Y-directional orbit is positive in the high $\theta_2$ mode but negative in the low $\theta_2$ mode, as will be detailed hereinafter, FIG. 3 shows absolute values of My for the low $\theta_2$ mode.

FIG. 4 shows the magnification ratio Mx/My. Since the magnification Mx in the high $\theta_2$ mode is lower by about a figure than Mx in the low $\theta_2$ mode according to the analysis result shown in FIG. 3, the magnification ratio in the high $\theta_2$ mode can take values smaller by about a figure than those in the low $\theta_2$ mode.

Next, FIG. 1 shows the X-directional orbit and Y-directional orbit of electron beam obtained by the analysis as described above. As shown in FIG. 1, the X-directional orbit greatly diverges in the second step quadrupole lens 23 in the high 74 2 mode (as shown by a solid line) and converges in the third step quadrupole lens 24. Because of this, the X-directional orbit can present a low magnification in the high $\theta_2$ mode. On the other hand, the X-directional orbit in the low $\theta_2$ mode (as shown by a broken line) diverges little in the second step quadrupole lens 23. Thus, the X-directional orbit in the low $\theta_2$ mode cannot present a lower magnification than the X-directional orbit in the high $\theta_2$ mode can.

The Y-directional orbit in high $\theta_2$ mode (as shown by a solid line) converges in the second step quadrupole lens 23 and diverges a little in the third step quadrupole lens 24. After the second step quadrupole lens 23, the Y-directional orbit in the low $\theta_2$ mode (as shown by a broken line) draws a symmetric orbit as the Y-directional orbit (solid line) in the high $\theta_2$ mode is inverted in a sign.

As seen from FIG. 1, the high $\theta_2$ mode, in which the X-directional orbit greatly diverges in the second step quadrupole lens 23 and converges in the third step quadrupole lens 24, is preferable to decrease the magnifications Mx, My and the magnification ratio Mx/My.

Next considered is the excitation condition $\theta_1$ of first step quadrupole lens 22 in high $\theta_2$ mode. FIG. 5 shows relations between $\theta_1$ and Mx, My, Mx/My in the high $\theta_2$ mode. The magnification My monotonously decreases with increase of $\theta_1$, while Mx diverges at $\theta_1=0.932$ (P$_1$) or at $\theta_1=3.4$ (P$_2$) in FIG. 5. It is seen from FIG. 5 that the optimum condition for stable operation, which can provide a small value of Mx/My and avoid the diverging points (P$_1$, P$_2$), is $\theta_1$ falling within the region A between the two diverging points (P1, P2). Mx can take a negative value depending upon the value of $\theta_1$. Therefore, FIG. 5 shows absolute values |Mx|, taking it into consideration.

Let us consider a specific example of the present invention in the following.

As detailed above, the following operation conditions of electron optic system with line cathode and the three steps of quadrupole lenses are necessary for obtaining a micro beam.

(1) The operation condition of the second step quadrupole lens must be in the high $\theta_2$ mode to obtain a higher magnification ratio, in which the X-directional orbit diverges in the second step quadrupole lens.

(2) Mx and Mx/My can be made lower and stabilized by setting the excitation condition $\theta_1$ of the first step quadrupole lens within the range between the diverging points of magnification Mx.

FIG. 1 shows a conceivable electron optic column having the line cathode and the three steps of quadrupole lenses satisfying the above conditions. A specific construction of the electron optic column according to the present invention may be for example based on $\theta_1=3$, $\theta_2=$high mode ($\theta_2=3.39$), $\theta_3=1.23$, a/L=5, s$_1$/L=3 and s$_2$/L=1.

In this example Mx=$1.1\times10^{-3}$, My=$1.3\times10^{-2}$ and Mx/My=$8.4\times10^{-2}$. Then, a beam in diameter of 0.1 $\mu$m was obtained on a sample, with a line cathode of 100 $\mu$m in a length and 10 $\mu$m in a width (aspect ratio of 10) and under b/L=1. A micro beam was obtained with the lens system composed only of quadrupole lenses.

Although the above embodiment was described as an example of electron optic column emitting an electron beam, the present invention is not limited to this example but can be applied for example to an optic column emitting an ion beam instead of the electron beam.

As described above, the present invention is effective to obtain a micro beam of substantial circle on the image plane only by the multi-pole lenses arranged in three steps, whereby the entire system can be made smaller and lighter.

What is claimed is:

1. An optic column comprising:
 a line beam source emitting a beam; and
 multi-pole lenses arranged in multiple steps, wherein
 a beam orbit in a direction of major axis of the line beam source and a beam orbit in a direction of minor axis of the line beam source coincide with each other on an image plane, and wherein
 a ratio of magnification of the beam orbit in the direction of major axis to magnification of the beam orbit in the direction of minor axis is coincident with a ratio of a length of the line beam source in the direction of minor axis to a length of the line beam source in the direction of major axis.

2. The optic column according to claim 1, wherein said multi-pole lenses are arranged in three steps, which have individual excitation conditions, and wherein
 the excitation condition of second step multi-pole lens is in a high mode.

3. The optic column according to claim 2, wherein the excitation condition of second step multi-pole lens in a high mode takes a value of 3 or more.

4. The optic column according to claim 2, wherein the excitation condition of first step multi-pole lens is set within a region between diverging points at which the magnification in the direction of major axis of the line beam source diverges.

5. The optic column according to claim 1, wherein the ratio of the length of the line beam source in the direction of minor axis to the length of the line beam source in the direction of major axis is about 1:10.

* * * * *